United States Patent [19]
Woodbury

[11] Patent Number: 5,856,700
[45] Date of Patent: Jan. 5, 1999

[54] SEMICONDUCTOR DEVICE WITH DOPED SEMICONDUCTOR AND DIELECTRIC TRENCH SIDEWALL LAYERS

[75] Inventor: Dustin Alexander Woodbury, Indian Harbour Beach, Fla.

[73] Assignee: Harris Corporation, Palm Bay, Fla.

[21] Appl. No.: 646,471

[22] Filed: May 8, 1996

[51] Int. Cl.$^6$ .................................................. H01L 29/00
[52] U.S. Cl. ........................................ 257/518; 257/588
[58] Field of Search ................................... 257/505, 518, 257/520, 586, 588, 514, 515

[56] References Cited

U.S. PATENT DOCUMENTS

| | | | |
|---|---|---|---|
| 3,722,079 | 3/1973 | Beasom | 29/578 |
| 3,847,687 | 11/1974 | Davidsohn et al. | 148/187 |
| 3,947,299 | 3/1976 | Weijland et al. | 257/515 |
| 4,140,558 | 2/1979 | Murphy et al. | 148/175 |
| 4,468,856 | 9/1984 | Fukushima | 29/577 C |
| 4,520,552 | 6/1985 | Arnould et al. | 29/571 |
| 4,717,682 | 1/1988 | Taka et al. | 437/31 |
| 4,791,462 | 12/1988 | Blanchard et al. | 357/23.4 |
| 4,868,631 | 9/1989 | Hollingsworth et al. | 357/48 |
| 4,910,572 | 3/1990 | Kameyama | 357/34 |
| 4,980,747 | 12/1990 | Hutter et al. | 357/50 |
| 4,992,843 | 2/1991 | Blossfeld et al. | 257/514 |
| 5,055,427 | 10/1991 | Haskell | 437/203 |
| 5,077,228 | 12/1991 | Eklund et al. | 437/40 |
| 5,105,253 | 4/1992 | Polllock | 357/49 |
| 5,183,781 | 2/1993 | Nakano | 437/191 |
| 5,187,554 | 2/1993 | Miwa | 257/586 |
| 5,198,376 | 3/1993 | Divakaruni et al. | 437/32 |
| 5,213,989 | 5/1993 | Fitch et al. | 437/31 |
| 5,217,919 | 6/1993 | Gaul et al. | 437/67 |
| 5,294,823 | 3/1994 | Ecklund et al. | 257/588 |
| 5,298,779 | 3/1994 | Nouailhat et al. | 257/273 |
| 5,411,911 | 5/1995 | Ikeda et al. | 437/52 |
| 5,422,296 | 6/1995 | Lage | 437/52 |
| 5,455,190 | 10/1995 | Hsu | 437/40 |
| 5,482,894 | 1/1996 | Havemann | 437/195 |

FOREIGN PATENT DOCUMENTS

| | | | |
|---|---|---|---|
| 55-108766 | 8/1980 | Japan | 257/588 |
| 9306622 | 4/1993 | WIPO | 257/588 |

*Primary Examiner*—Mark V. Prenty
*Attorney, Agent, or Firm*—Jaeckle Fleischmann & Mugel, LLP

[57] ABSTRACT

The present invention is directed to a semiconductor device having an ohmic contact to a buried layer. The device includes a device wafer having on its first surface a first dielectric layer and on its second surface a doped epitaxial layer that comprises a dopant having a first polarity. The device also includes a doped first layer that is contiguous to the dielectric layer and comprises a dopant having a first polarity. The semiconductor device of the present invention further comprises a plurality of trenches, each having spaced apart sidewalls and extending from an upper surface of the epitaxial layer through the epitaxial layer to a trench floor. At least a portion of the trenches include a layer of doped semiconductor material disposed on the sidewalls. This layer provides electrical contact between the doped first layer of first polarity and a surface collector region, also of first polarity, of the epitaxial layer. A layer of dielectric material covers the sidewall layer of doped semiconductor material. The invention is further directed to a process for forming the described semiconductor device.

10 Claims, 3 Drawing Sheets

SEMICONDUCTOR DEVICE WITH DOPED SEMICONDUCTOR AND DIELECTRIC TRENCH SIDEWALL LAYERS

FIELD OF THE INVENTION

This invention relates in general to semiconductor devices containing buried layers and, more particularly, to a semiconductor device that includes trenches provided with sidewall layers doped semiconductor material and dielectric material, and also a process for forming same.

BACKGROUND OF THE INVENTION

An integrated circuit includes one or more regions or layers of conductive material that are isolated from other conductive regions or conductive layers. Such isolation may be in the form of junction isolation by juxtaposing regions or layers of opposite polarity next to one another. Isolation can also be achieved dielectrically by providing a dielectric region, layer or structure between selected conductive regions and between selected transistors or other devices in the integrated circuit. In certain devices, the entire integrated circuit is insulated from bulk substrate material by providing a buried dielectric layer. Such devices are termed silicon-on-insulator or SOI devices due to a buried insulative layer which isolates the active devices from the bulk silicon of the substrate. Certain SOI devices may also be formed using a bonded wafer technique. With that technique, a device wafer is bonded to a handle wafer by a silicon dioxide surface layer formed on either or both wafers. Thus, the bonded wafer has a buried dielectric layer beneath the device wafer.

While the above SOI techniques provide for vertical electrical dielectric isolation, other techniques laterally insulate adjacent transistors or devices. One such technique provides trenches around the devices. The trenches are patterned in the surface of the semiconductor substrate in which devices are formed or are to be formed. Trench isolation processes are commonly performed early in the process of fabricating an integrated circuit, prior to the major diffusions that form the transistors and other devices and before completion of thick thermal oxide growth. The trenches typically are filled with dielectric material and polysilicon. In U.S. Pat. No. 4,140,558, the trench in the substrate is filled with an oxide provided by thermal oxidation of the substrate material that forms the walls and floor of the trench. In U.S. Pat. No. 5,217,919, the trench in the substrate is filled with a thermal oxide during the step of local thermal oxidation. Such a so-called LOCOS step is generally performed after substantial diffusions form larger regions of the devices, e.g., after formation of the collector regions in bipolar devices or after the formation of well regions in MOS devices. LOCOS is a common step in the fabrication of many, but not all, devices. However, the fabrication of most devices includes a step of thermal oxidation where an oxide layer is grown and the thickness of the oxide layer exceeds 500 Angstroms.

Such prior art techniques have encountered or been the source of problems. Since the oxide that seals the sidewalls of the trench is thermally grown early in the prior art fabrication of the integrated circuit, the exposed top surface of the sidewall oxide is subject to etching that occurs later in the fabrication processes. In some cases an oxide etch may remove trench sidewall oxide, for example, in the complete oxide strip common before pad oxide growth in LOCOS processes. If the trench is filled with polysilicon or other material, the desired electrical insulation of the trench may be reduced and thereby adversely affect the overall reliability of the device. It has also been observed that crystal damage results from excess sidewall oxide growth. As pointed out above, the trench is formed and dielectrically isolated early in the fabrication of the integrated circuit. However, the oxide in the filled trench (particularly the oxide at the exposed top surface) will continue to grow when the wafer is subject to subsequent thermal oxide processes, e.g., the LOCOS step. During thermal oxidation, the substrate material, typically silicon, combines with oxygen to form silicon dioxide. So, each oxidized silicon atoms grows by the volume of two oxygen atoms. A molecule of silicon dioxide has approximately twice the volume of an atom of silicon. Such thermal oxidation effectively doubles the volume of the silicon. If the trench sidewall oxide growth is excessive, mechanical stresses are created by the trench oxide expansion and those stresses generate crystalline lattice defects in adjacent silicon device regions. Such defects increase device leakage and reduce overall yield. Such excess thermal oxide growth may also occur during any high temperature processing step such as diffusions and drive-in of implants.

Most integrated circuits have one or more buried layers. The buried layer may comprise a buried collector for a bipolar device or a buried drain for a field effect transistor. To make electrical contact between a surface region and a heavily doped buried layer within a semiconductor device, it is common practice to deep diffuse a dopant vertically from the surface through the device to the buried layer. Heating down diffuses a dopant from the surface and up diffuses a dopant from the buried layer. However the dopant also exhibits a lateral diffusion profile in addition to the vertical profile such that its down diffusion may fall short of meeting the buried layer up diffusion. In addition, lateral diffusion of the dopant may well cause undesirable interactions with other dopant diffusions. In either case, the lateral diffusion occupies a substantial volume. It is desirable to reduce that volume and thereby reduce the overall size of the device.

The aforementioned dopant diffusion difficulties may be overcome by introducing the contact dopant into the device through the sidewalls of an open trench prior to filling. Under these circumstances, the diffusion profile is predominantly lateral and less sensitive to the depth of the device islands, thereby ensuring reliable electrical contact between the device surface and the buried layer.

U.S. Pat. No. 4,717,682 discloses a semiconductor device characterized by junction isolation and a conductive layer of impurity-doped polysilicon on an inner surface of a trench. The trench is filled with an insulating material such as silicon dioxide. However, as discussed above, thick oxide deposits in trenches are susceptible to mechanical stresses and consequent crystalline lattice defects in adjacent regions of the device.

U.S. Pat. No. 4,910,572 discloses a device having junction isolation and a trench filled with a conductive material such as polysilicon that connects a buried layer with a surface contact. Conductive trenches leading to buried layers are also described in U.S. Pat. Nos. 5,298,779 and 4,980,747. Other examples of polysilicon filled trenches establishing contact to buried layers are included in U.S. Pat. Nos. 5,077,228; 4,520,552; and 3,847,687.

U.S. Pat. No. 4,468,856 describes a method for forming an ohmic contact to a semiconductor substrate that entails diffusing a dopant from a poly silicon layer downward to a buried layer. U.S. Pat. No. 5,183,781 discloses a semiconductor device with an etched contact hole lined with doped polysilicon and filled with undoped polysilicon, the hole being in contact with an underlying N-type diffusion layer as the source or drain region of an MOS transistor.

SUMMARY OF THE INVENTION

The present invention is directed to a semiconductor device having an ohmic contact to a buried layer. The device includes a device wafer having on its first surface a first dielectric layer and on its second surface a doped epitaxial layer that comprises a dopant having a first polarity. The device also includes a doped buried layer that is contiguous to the dielectric layer and comprises a dopant having a first polarity.

The semiconductor device of the present invention further comprises a plurality of trenches, each having spaced apart sidewalls and extending from an upper surface of the epitaxial layer through the epitaxial layer to a trench floor. At least a portion of the trenches include a layer of doped semiconductor material disposed on the sidewalls. This layer provides electrical contact between the doped buried layer of first polarity and a surface collector region, also of first polarity, of the epitaxial layer. A layer of dielectric material covers the sidewall layer of doped semiconductor material.

The invention is further directed to a process for forming a semiconductor device that comprises providing a first dielectric layer on a first surface of a device wafer and heavily doping the wafer with a dopant having a first polarity, thereby forming a doped first layer contiguous to the dielectric layer. A doped epitaxial layer that includes a dopant of the first polarity is formed on a second surface of the device wafer.

The process further comprises forming a plurality of trenches in the wafer, each trench extending from an upper surface of the epitaxial layer through the epitaxial layer to a trench floor. A layer of semiconductor material comprising a dopant of first polarity is formed on the sidewalls of at least a portion of the trenches. The dopant is diffused from the doped semiconductor sidewall layer into the device wafer to form an electrical connection between the doped buried layer and a surface collector region of the epitaxial layer. On each layer of doped semiconductor material on the trench sidewalls is formed a layer of dielectric material.

DETAILED DESCRIPTION OF THE INVENTION

Figure 1:
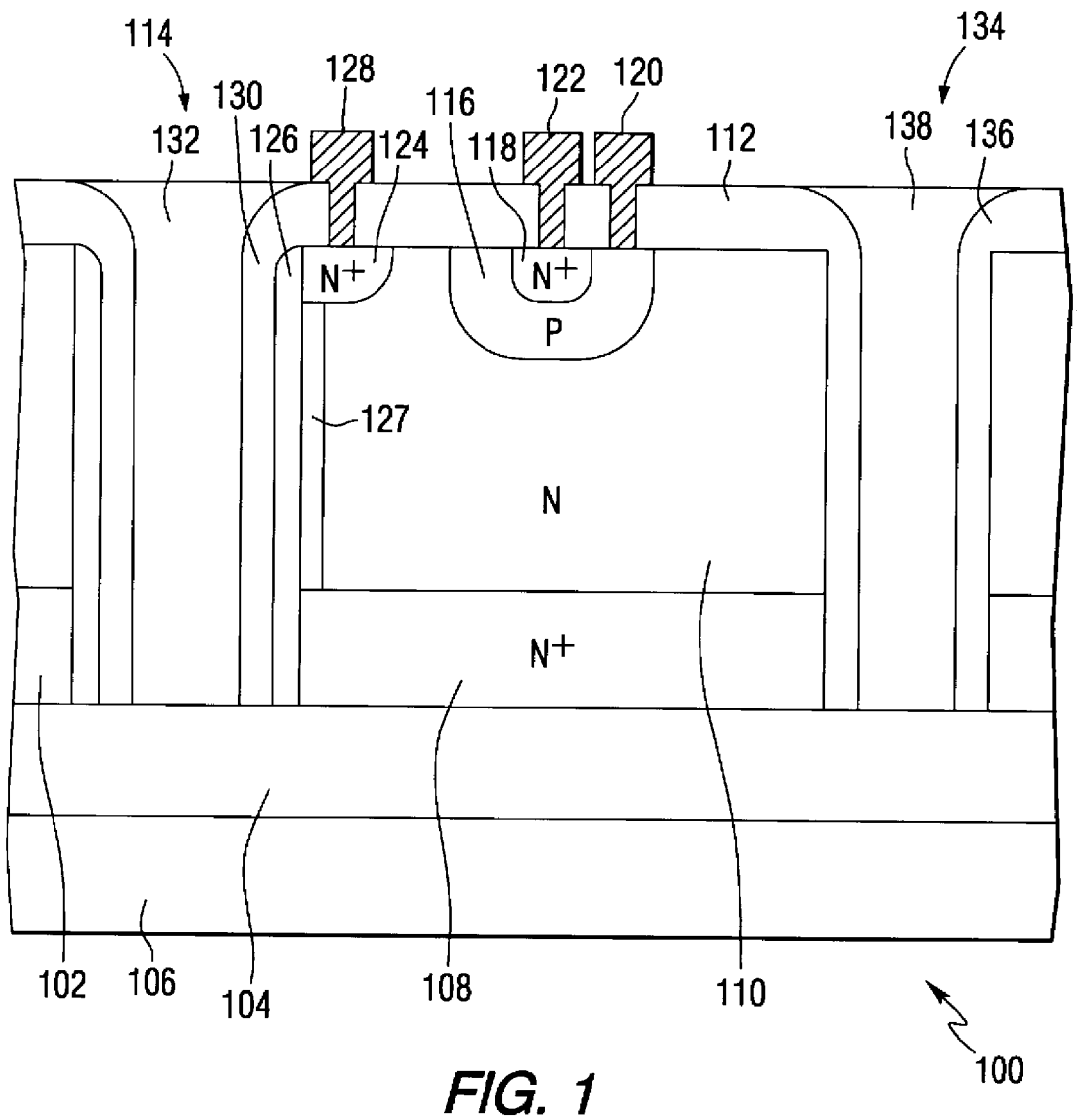
FIG. 1 is a schematic representation of a semiconductor device of e present invention.

FIG. 1 is a schematic sectional view of a semiconductor device of the present invention. The depicted embodiment, device 100, is a NPN bipolar transistor, but the novel feature of the invention may be applied as well to PNP transistors and other devices utilizing buried layers, including but not limited to vertical field effect transistors.

The device 100 includes a device wafer 102 bonded to a handle wafer 106 via an interposed dielectric layer 104, which can be silicon dioxide. The dielectric layer 104 may be included in either device wafer 102 or handle wafer 106, or in both. A heavily doped n$^+$-type first layer 108 is formed in wafer 102 adjacent to dielectric layer 104. Also included in the wafer 102 is an epitaxial layer 110.

Epitaxial layer 110 is covered with a patterned dielectric layer 112, and a contact trench 114 is etched through epitaxial layer 110 to dielectric layer 104, which provides a floor for trench 114. A lightly doped p-type region 116 in device wafer 102 provides a base for the NPN transistor. Within region 116 is a heavily doped n$^+$-type emitter region 118. Regions 116 and 118 are connected to, respectively, base contact electrode 120 and emitter contact electrode 122.

Also included in device wafer 102 is a heavily doped n$^+$-type collector region 124. Contact trench 114 has an n$^+$-type sidewall layer 126 of heavily doped semiconductor material, preferably doped polysilicon. Heating of wafer 102 causes dopant to diffuse from layer 126 into the adjacent monocrystalline silicon and thereby form vertical region 127. Surface region 124 may be formed simultaneously with, or separately from, vertical region 127. The vertical region 127 provides a single crystal electrical connection between buried layer 108 and surface collector region 124, which is provided with a collector contact electrode 128. Sidewall layer 126 is covered by a dielectric layer 130, preferably silicon dioxide. Oxide layer 130 provides a barrier against dopant diffusion into trench fill material, enabling more effective concentration of the dopant in region 127 connecting the buried layer with the device surface. Trench 114 containing sidewall layers 126 and 130 is filled with semiconductor material 132, preferably undoped polysilicon. Filling trench 104 with undoped polysilicon rather than silicon dioxide is accomplished conveniently and avoids possible stress-related defects in the device. A dielectric layer (not shown) is subsequently formed over semiconductor material 132.

Also shown in FIG. 1 is an isolation trench 134 that extends from the upper surface of epitaxial layer 110 to dielectric layer 104. Trench 134, which includes sidewall layers 136 of a dielectric layer, preferably silicon dioxide, and is filled with a semiconductor material 138, preferably undoped polysilicon, serves to isolate one device island from another.

The process for forming an NPN bipolar transistor that is an embodiment of the present invention is described in FIGS. 2A–D.

Figure 2A:
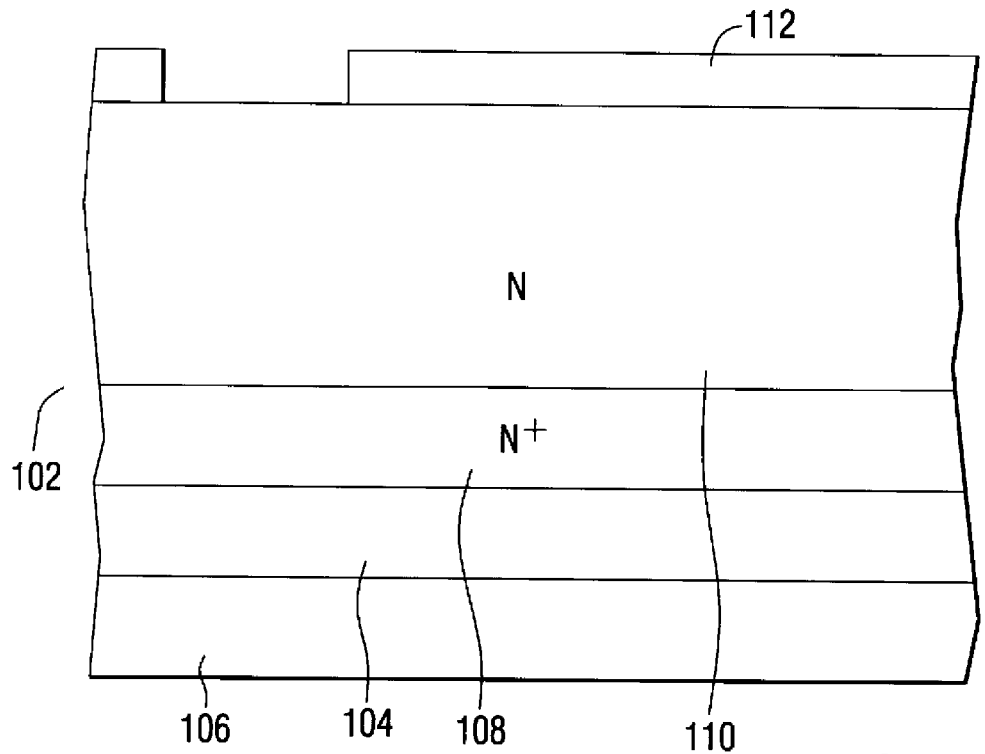
FIGS. 2A–D schematically depict a process for forming a bipolar transistor embodiment of the present invention.

As shown in FIG. 2A, the device wafer 102 is bonded to the handle wafer 106 via the oxide dielectric layer 104. The heavily doped n$^+$-type first layer 108 is formed in wafer 102, and the n-type epitaxial layer 110 is deposited on layer 108. A patterned dielectric layer 112, preferably comprising silicon dioxide, is formed on epitaxial layer 110.

Figure 2B:
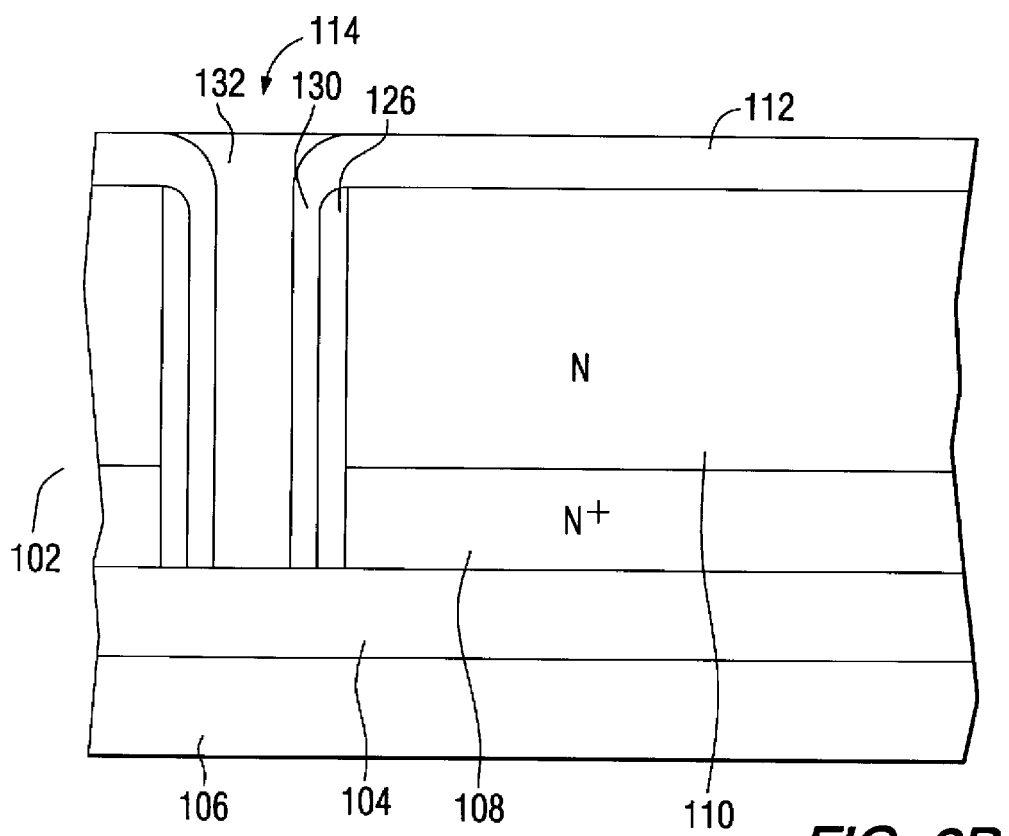

As shown in FIG. 2B, a contact trench 114 having a width of about 2 $\mu$m to 6 $\mu$m, preferably about 3 $\mu$m to 5 $\mu$m, is etched by anisotropic etching through the epitaxial layer 110 and the buried layer 108 to the oxide dielectric layer 104. A layer of polysilicon having a thickness of about 0.5 $\mu$m to 2 $\mu$m, preferably about 0.75 $\mu$m to 1.5 $\mu$m, and containing an n-type dopant such as, for example, P or P + As, at a concentration of about $1\times10^{16}$ to $1\times10^{18}$ cm$^{-3}$, is deposited by chemical or physical vapor deposition on the sidewalls and floor of trench 114 and on the surface of dielectric layer 112. The portions of the doped polysilicon layer on the trench floor and on 30 the dielectric layer surface are removed by reactive ion etching (RIE), leaving only the layer 126 on the trench sidewalls. A dielectric layer 130, preferably silicon dioxide, is formed on doped polysilicon sidewall layer 126, and the remainder of trench 114 is filled with a semiconductor material 132 that is preferably undoped polysilicon.

Figure 2C:
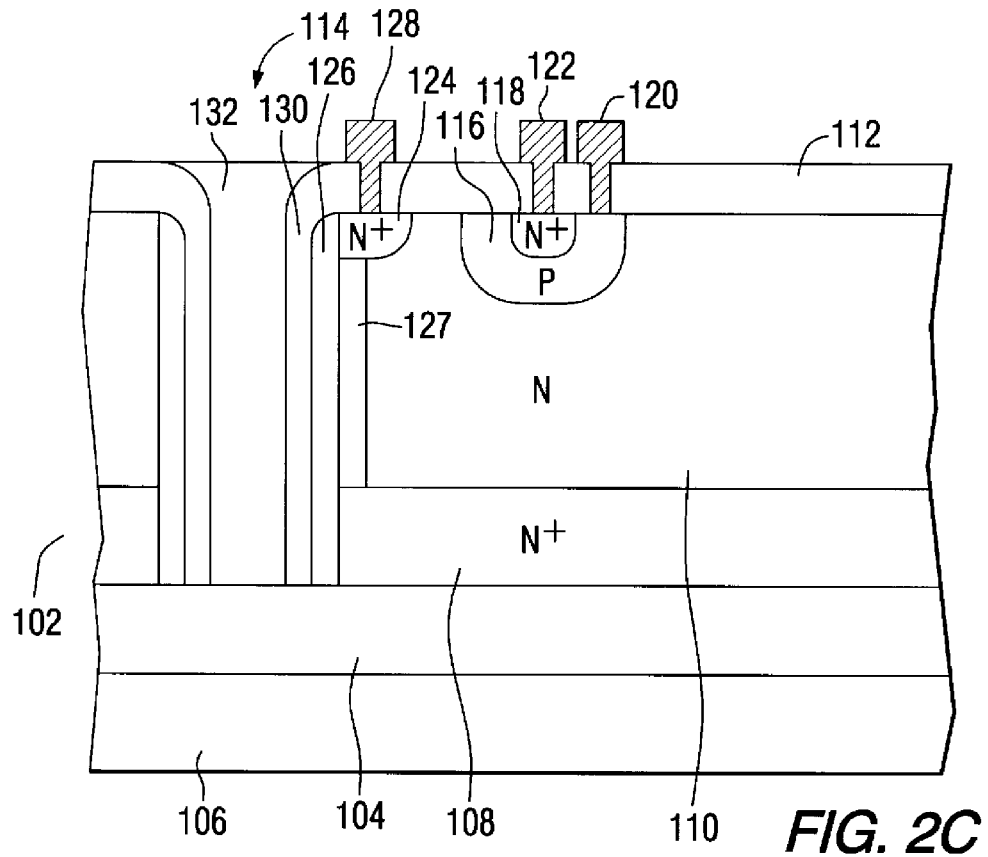

Wafer 102 is heated to cause dopant to diffuse from sidewall layer 126 to adjacent monocrystalline silicon, thereby forming vertical region 127, which extends from region 124 to buried layer 108. As shown in FIG. 2C, an integrated circuit that includes the heavily doped n$^+$-type collector region 124, the lightly doped p-type base region 116, the heavily doped n$^+$-type emitter region 118, and the corresponding contact electrodes 128, 120, and 122 is constructed in the device by methods well known in the art.

Figure 2D:
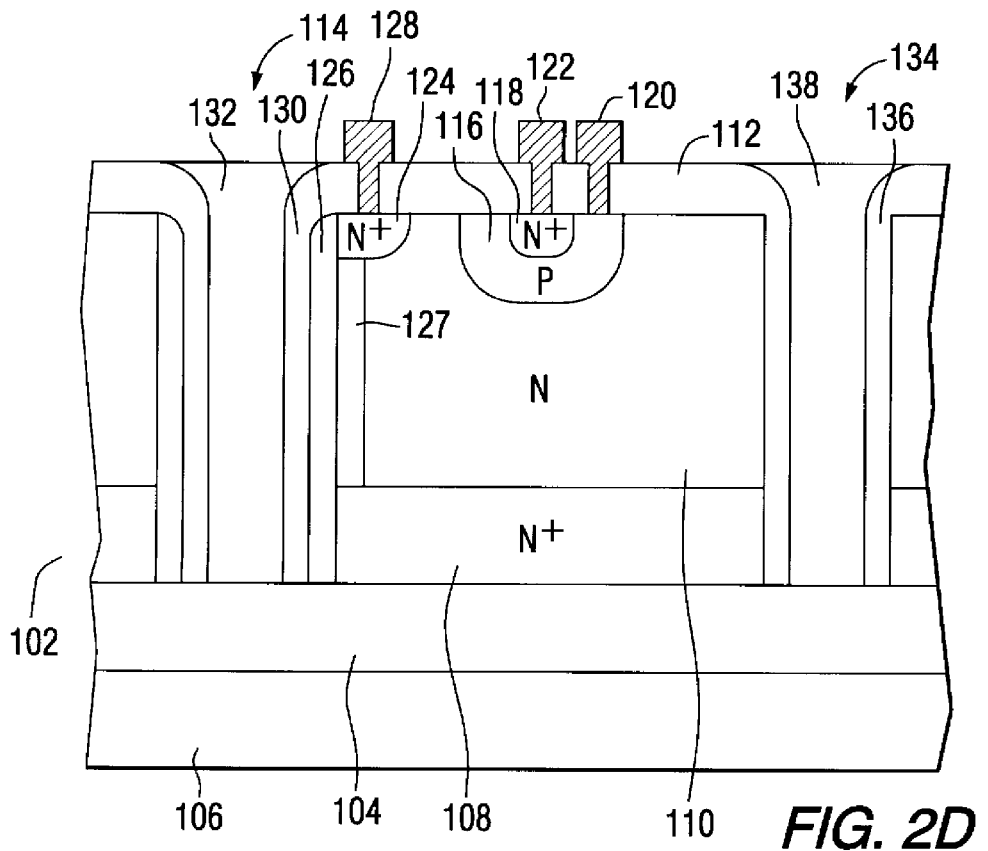

As shown in FIG. 2D, the isolation trench 134 is etched through epitaxial layer 110 and buried layer 108 to the dielectric layer 104. Because dielectric layer 104 comprises the floor of trench 134, it is not necessary to form a channel stop region below trench 134. A silicon dioxide dielectric layer 136 having a thickness of about 1 μm to 3 μm, preferably about 1.5 μm to 2.5 μm, is deposited or thermally grown on the sidewalls of trench 134, which is then filled with undoped polysilicon semiconductor material to produce device 100.

Although the process depicted in FIGS. 2A–D depicts the etching and filling of contact trench 114 preceding the etching and filling of isolation trench 134, the sequence may be reversed so that the formation of the doped trench 114 occurs later in the process. This alternative ordering of steps may be advantageous for avoiding over driven sidewall doping. Doping under these circumstances may be accomplished by, for example, open tube phosphorus deposition.

The invention has been described in detail for the purpose of illustration, but it is understood that such detail is solely for that purpose, and variations can be made therein by those skilled in the art without departing from the spirit and scope of the invention, which is defined by the following claims.

What is claimed is:

1. A semiconductor device having an ohmic contact to a buried layer comprising:
   a device wafer of monocrystalline semiconductor material having a first and a second surface;
   a first dielectric layer disposed on said device wafer first surface;
   a heavily doped buried layer contiguous to said dielectric layer and comprising a dopant having a first polarity;
   a doped epitaxial layer disposed on said wafer second surface and comprising a dopant having said first polarity;
   a plurality of trenches, each said trench comprising spaced apart sidewalls and extending from an upper surface of the epitaxial layer through said epitaxial layer to a trench floor, wherein at least a portion of said trenches include a layer of doped semiconductor material disposed on the sidewalls, said layer comprising a dopant having said first polarity and providing electrical contact between the doped buried layer and a surface collector region in said monocrystalline semiconductor material having said first polarity, and a layer of dielectric material disposed on each said layer of doped semiconductor material disposed on the sidewalls and acting as a diffusion barrier to prevent dopants in said sidewall semiconductor material from diffusing into said trench and for enabling an effective concentration of said dopant in the device layer adjacent said trench.

2. The semiconductor device of claim 1, further comprising:
   a second dielectric layer disposed on said doped epitaxial layer.

3. The semiconductor device of claim 1, wherein said first and second dielectric layers and the layer of dielectric material on said trench sidewalls comprise silicon dioxide.

4. The semiconductor device of claim 1, wherein the floors of at least a portion of said trenches comprise the dielectric layer disposed on said wafer first surface.

5. The semiconductor device of claim 1 further comprising:
   a handle wafer bonded to said device layer, said handle wafer including the dielectric layer disposed on said device wafer first surface.

6. The semiconductor device of claim 1, wherein said doped semiconductor material disposed on said sidewalls comprises doped polysilicon.

7. The semiconductor device of claim 6, wherein the trenches containing sidewall layers of doped polysilicon and dielectric material are filled with undoped polysilicon.

8. The semiconductor device of claim 1, wherein the upper surface of at least a portion of said epitaxial islands further compromises a base region having a second polarity opposite to that of said first polarity, each said base region encompassing an emitter region having said first polarity.

9. The semiconductor device of claim 8, wherein said first polarity is n and said second polarity is p.

10. The semiconductor device of claim 8, wherein said first polarity is p and said second polarity is n.

\* \* \* \* \*